United States Patent [19]

Hasircoglu

[11] Patent Number: 4,753,005

[45] Date of Patent: Jun. 28, 1988

[54] MULTICONDUCTOR ELECTRICAL CABLE TERMINATIONS AND METHODS AND APPARATUS FOR MAKING SAME

[75] Inventor: Alexander W. Hasircoglu, Lancaster, Pa.

[73] Assignee: E. I. Du Pont de Nemours and Company, Wilmington, Del.

[21] Appl. No.: 52,486

[22] Filed: May 21, 1987

Related U.S. Application Data

[62] Division of Ser. No. 769,724, Aug. 27, 1985, Pat. No. 4,679,868.

[51] Int. Cl.$^4$ ............................ H05K 3/00; H01R 4/66
[52] U.S. Cl. ........................................ 29/829; 29/33 M; 29/564.8; 439/77; 439/98; 439/497
[58] Field of Search ................ 29/33 M, 564, 8, 829, 29/831; 439/77, 98, 497

[56] References Cited

U.S. PATENT DOCUMENTS

| | | | |
|---|---|---|---|
| 3,337,834 | 8/1967 | Godwin et al. | 339/14 |
| 3,731,251 | 5/1973 | Sinclair | 339/17 |
| 4,005,921 | 2/1977 | Hadden | 339/14 |
| 4,130,334 | 12/1978 | Anderson | 339/103 |
| 4,157,612 | 6/1979 | Rainal | 339/176 |
| 4,169,641 | 10/1979 | Olsson | 339/17 |
| 4,252,389 | 2/1981 | Olsson | 339/17 |
| 4,262,413 | 4/1981 | Morton | 29/605 |
| 4,295,254 | 10/1981 | Adams et al. | 29/33 |
| 4,314,312 | 2/1982 | Donmoyer et al. | 361/400 |
| 4,358,172 | 11/1982 | Narozny | 339/17 |
| 4,365,284 | 12/1982 | Tanaka | 361/395 |
| 4,391,038 | 7/1983 | Greene et al. | 29/829 |
| 4,448,474 | 5/1984 | Melnychenko | 339/103 |
| 4,451,099 | 5/1984 | Bricker, Jr. et al. | 339/14 |
| 4,682,828 | 7/1987 | Piper et al. | 439/77 X |

FOREIGN PATENT DOCUMENTS 2741791 7/1978 Fed. Rep. of Germany .

Primary Examiner—Eugene F. Desmond

[57] ABSTRACT

Cables having interspersed co-planar signal and ground wires are terminated at a planar circuit board by stapling the cable to the circuit board with a bus member, mechanically and electrically connecting the signal wires to signal wire termination sites which are downstream from the bus member, folding the ground wires back over the bus member, and mechanically and electrically connecting the ground wires to the bus member.

11 Claims, 5 Drawing Sheets

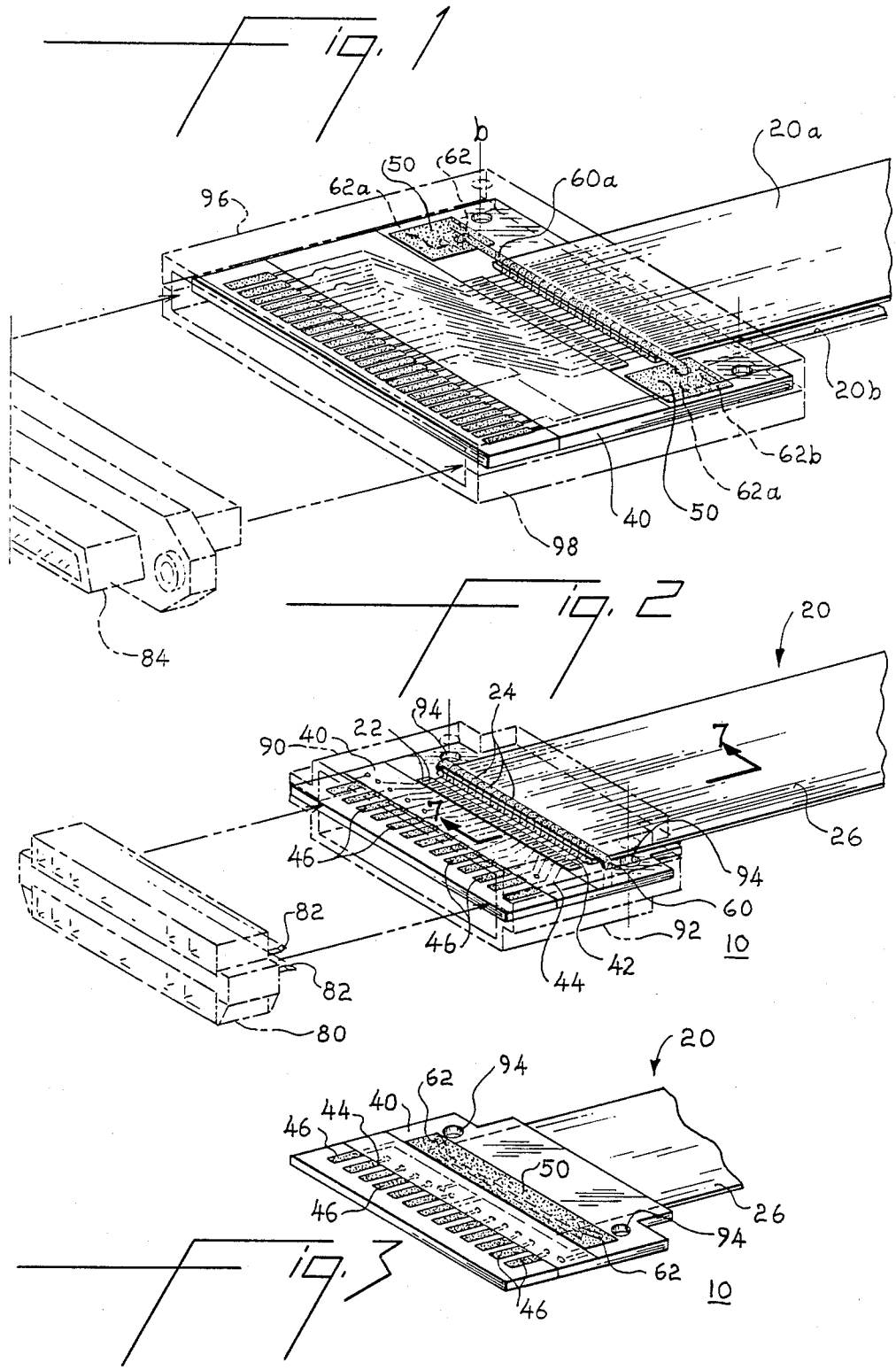

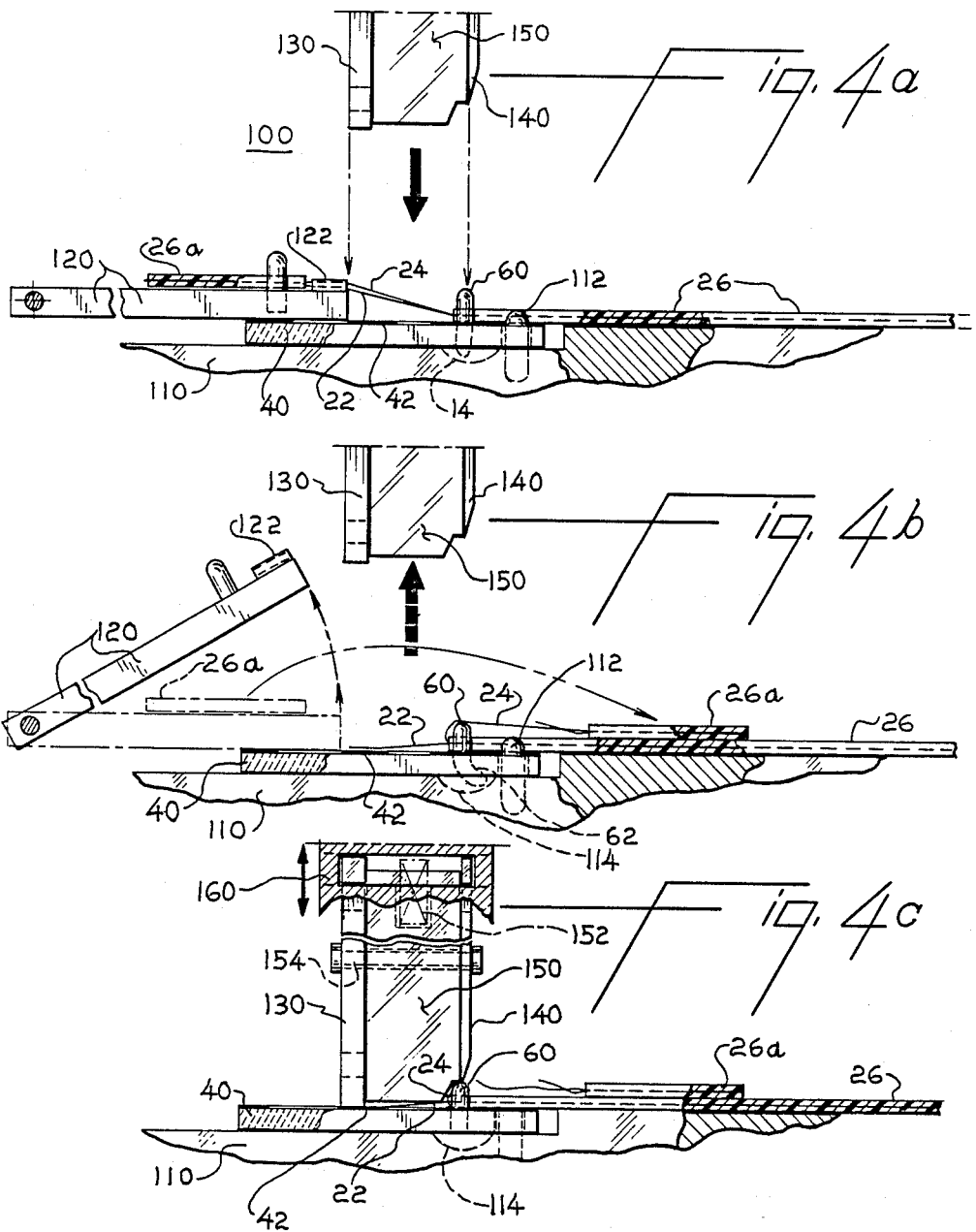

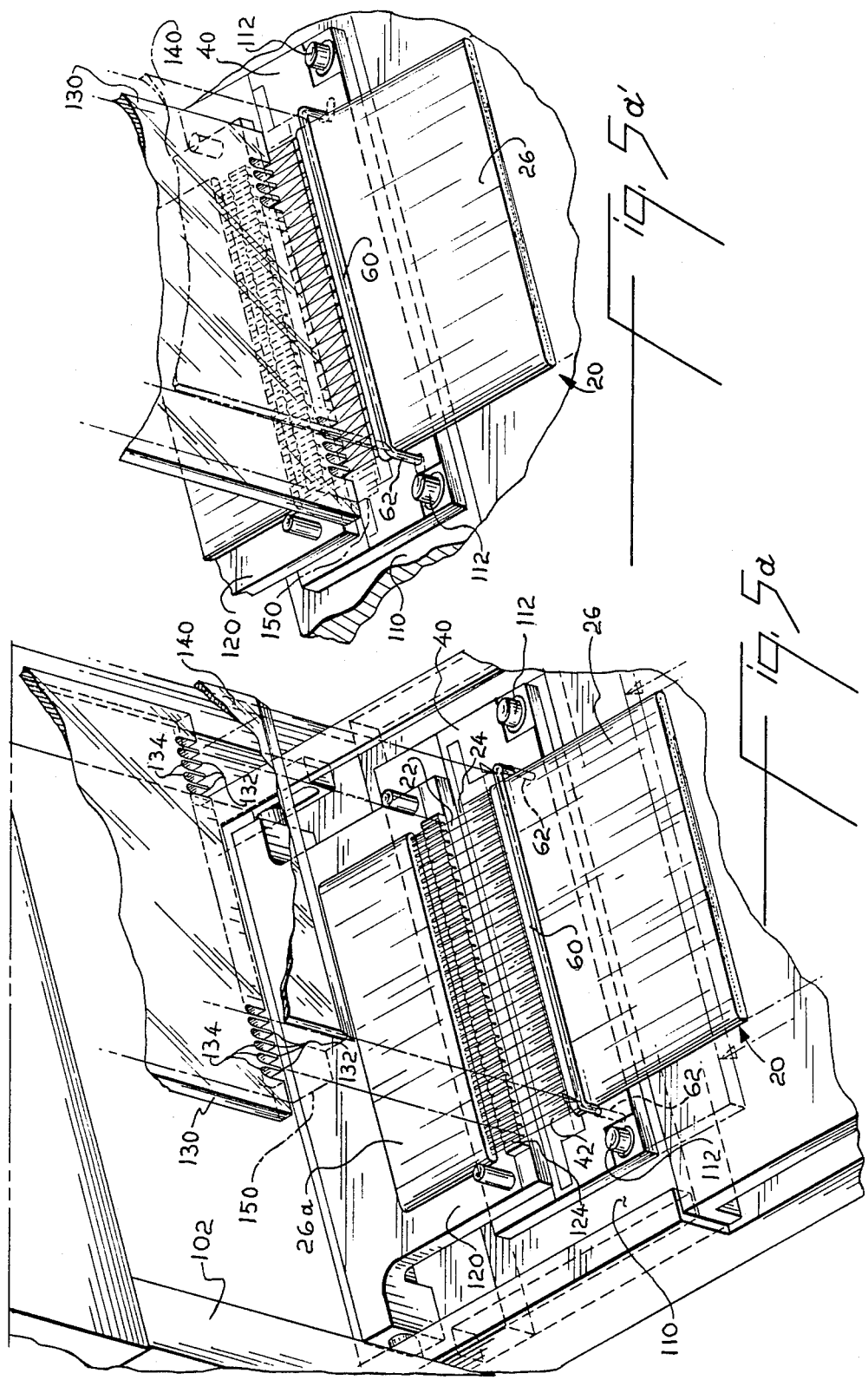

MULTICONDUCTOR ELECTRICAL CABLE TERMINATIONS AND METHODS AND APPARATUS FOR MAKING SAME

This is a division of application Ser. No. 769,724, filed Aug. 27, 1985, now U.S. Pat. No. 4,679,868 issued Jul. 14, 1987.

BACKGROUND OF THE INVENTION

This invention relates to terminations for multiconductor cables having interspersed, substantially co-planar, signal and ground conductors. The invention also relates to methods and apparatus for making such terminations.

One type of electrical cable frequently employed in modern electronic equipment such as computers is a planar or ribbon cable having a plurality of parallel, laterally spaced, co-planar signal wires interspersed with ground wires. There may be one ground wire between each laterally adjacent pair of signal wires, or there may be two or more ground wires between each pair of signal wires. The ground wires are co-planar with the signal wires. Each signal wires is electrically insulated from the adjacent ground wires, as well as from all of the other signal wires. The signal wires typically carry the useful electrical signals in the associated electronic apparatus. The ground wires are provided to allow increased signal transmission rates, to reduce interference between the signal wires, etc. Cables of this type are sometimes known as signal line transmission or SLT cables, and that designation will sometimes be employed herein.

SLT cables are typically relatively small. For example, an SLT cable having 20 signal wires, each separated from each adjacent signal wire by two ground wires, may be only approximately one inch wide. In order to terminate such cables (i.e., connect the cable to other apparatus), the many closely spaced signal and ground wires must be separated from one another and mechanically and electrically connected to other circuit elements. This is a difficult, tedious, and time-consuming task which is also subject to error. Methods and apparatus which have been devised to facilitate this process are relatively complex and expensive.

In view of the foregoing, it is an object of this invention to provide improved terminations for SLT cables.

It is another object of this invention to provide improved and simplified methods and apparatus for making SLT cable terminations.

SUMMARY OF THE INVENTION

These and other objects of the invention are accomplished in accordance with the principles of the invention by providing an SLT cable termination including an electrical circuit board having a longitudinal array of laterally spaced signal wire termination sites on a first of the major surfaces of the board. The end of an SLT cable is secured to the circuit board by means of an electrically conductive longitudinal bus member substantially parallel to the longitudinal axis of the termination site array. The plane of the cable is parallel to the first major surface, and the end portion of the cable insulation is sandwiched between the mid-portion of the bus member and the first major surface. The ends of the bus member extend down through the circuit board and are clinched against the opposite second major surface of the board. Uninsulated portions of the signal wires extend forwardly from the end portion of the cable insulation, and each of these signal wire portions is mechanically and electrically connected to a respective one of the signal wire termination sites, e.g., by solder. Uninsulated end portions of the ground wires are bent back over the mid-portion of the bus member and are mechanically and electrically connected to the bus member (e.g., by solder). If desired, a housing member can be applied over the first major surface to protect the termination. The housing may include means for mechanically gripping the insulation of the cable upstream of the bus member to reinforce the mechanical connection between the cable and the circuit board. A second cable may be terminated on the opposite surface of the circuit board in the same manner. Both cables may extend from the circuit board in the same direction. In this way several terminations can be connected along a cable to provide a "daisy chain" of terminations.

The SLT terminations of this invention can be made by cutting through the insulation (but not the wires) of the cable adjacent its end. The severed end portion of the insulation is pulled away from the unsevered remainder of the insulation to expose a portion of the signal and ground wires, but the ends of the signal and ground wires preferably remain in the severed end portion of the insulation. A longitudinal wire guide is placed over the first major circuit board surface so that the guide is substantially parallel to the longitudinal axis of the signal wire termination site array and on the opposite side of that array from the bus member site. The SLT cable, prepared as described above, is placed on the circuit board so that the longitudinal axis of the cable is substantially perpendicular to the longitudinal axis of the signal wire termination site array, so that the uninsulated portions of the wires traverse the signal wire termination sites and the wire guide, and so that the unsevered end portion of the insulation is at the bus member site. The bus member is installed so that the unsevered end portion of the insulation is sandwiched between the mid-portion of the bus member and the circuit board and so that the end portions of the bus member pass through the circuit board and are clinched against the opposite side of the board. The signal wires (but not the ground wires) are cut between the signal wire termination site array and the wire guide. The severed end portion of the insulation is bent back adjacent to the unsevered remainder of the insulation upstream of the bus member so that the ground wires pass over the mid-portion of the bus member. The ground wires passing over the bus member are cut at the bus member. Each signal wire is mechanically and electrically connected to a respective one of the signal wire termination sites (e.g., by solder). All of the ground wires are similarly mechanically and electrically connected to the top of the mid-portion of the bus member (e.g., by solder). If desired, the foregoing steps can be repeated to terminate a second SLT cable on the other side of the circuit board.

Apparatus for making the SLT cable terminations of this invention may comprise a base for supporting the circuit board with its first major surface exposed. A longitudinal wire guide is placed over the circuit board parallel to the longitudinal axis of the signal wire termination site array and with that array between the wire guide and the bus member site. An SLT cable, prepared as described above, is placed on the circuit board as described above. A bus member is placed across the unsevered end portion of the insulation with the end portions of the bus member extending down through holes in the circuit board. A signal wire cutter cuts the signal wires (but not the ground wires) between the wire guide and the signal wire termination site array. A ground wire cutter forces the bus member down against the cable so that the ends of the bus member are clinched against the other side of circuit board by the base. No ground wires are cut on this stroke of the ground wire cutter. The signal wire cutter and ground wire cutter are retracted. The severed end portion of the insulation is bent back as described above. The ground wire cutter is operated again to cut the ground wires on top of the bus member. Each signal wire is mechanically and electrically connected to a respective one of the signal wire termination sites (e.g., by solder), and all of the ground wires are similarly mechanically and electrically connected to the top of the bus member (e.g., by solder).

Further features of the invention, its nature and various advantages will be more apparent from the accompanying drawings and the following detailed description of the invention.

BRIEF DESCRIPTION OF THE DRAWINGS

FIG. 1 is a perspective view of an illustrative SLT cable termination constructed in accordance with the principles of this invention.

FIG. 2 is a perspective view of another illustrative SLT cable termination constructed in accordance with the invention.

FIG. 3 is a perspective view of the under side of the termination of FIG. 2.

FIG. 4a is a side elevational view of a portion of apparatus constructed in accordance with this invention which can be used to make the SLT cable terminations of this invention. FIG. 4a shows an early stage in operating cycle of the apparatus.

FIGS. 4b and 4c are views similar to FIG. 4a showing successive stages in the operating cycle of the apparatus.

FIG. 5a is a perspective view of the apparatus of FIG. 4 showing the same stage in the operating cycle as is shown in FIG. 4a.

FIGS. 5a', 5b, and 5c are views similar to FIG. 5a. FIG. 5a' shows a stage in the operating cycle intermediate the stages shown in FIGS. 4a and 4b.

DETAILED DESCRIPTION OF THE INVENTION

Figure 5B:
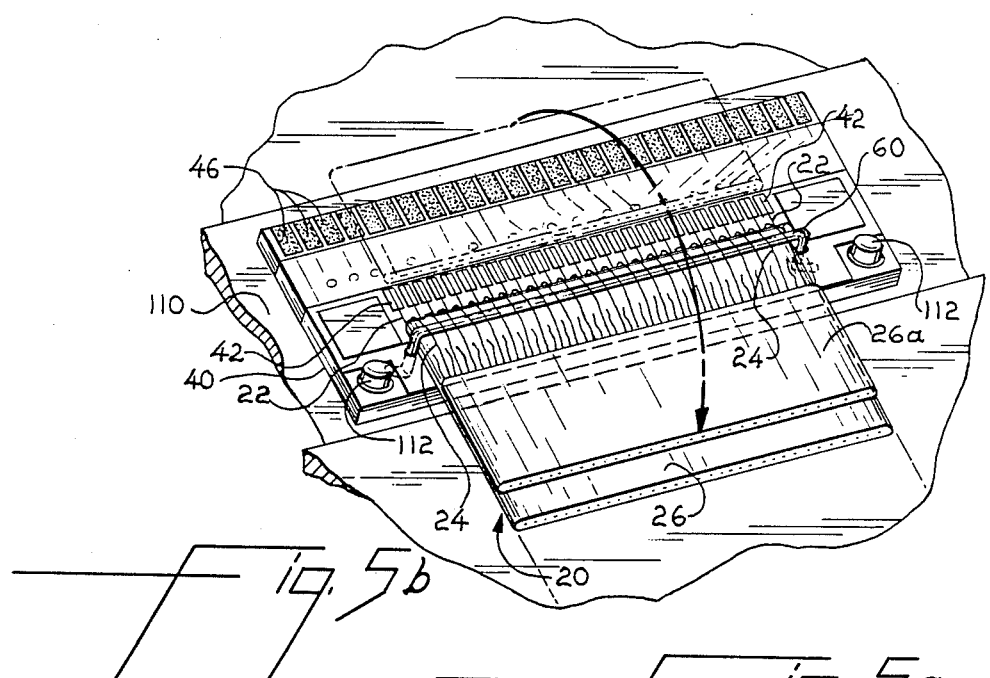
FIGS. 5b and 5c show the same operating cycle stages as are shown in FIGS. 4b and 4c, respectively.

As shown in FIGS. 2 and 3, an illustrative SLT cable termination 10 constructed in accordance with the principles of this invention includes SLT cable 20 which is mechanically and electrically connected to electrical circuit board 40. Cable 20 includes a plurality of parallel, laterally speced, co-planar signal wires 22. Signal wires 22 are interspersed with co-planar ground wires 24, and all of wires 22 and 24 are electrically insulated from one another by a single insulating jacket 26.

The plane of cable 20 is parallel to the plane of circuit board 40. The end portion of insulating jacket 26 is mechanically secured to circuit board 40 by means of longitudinal metal bus member 60 which acts like a staple. The end portions 62 of bus member 60 pass through apertures in circuit board 40 and are clinched against the lower surface of the circuit board as shown in FIG. 3.

The uninsulated end portion of each signal wire 22 is mechanically and electrically connected (e.g., by solder) to a respective one of signal wire termination sites 42, which are printed or otherwise conventionally formed in a longitudinal array on the upper major surface of circuit board 40. Signal wire termination sites 42 are typically electrically insulated from one another, and each is respectively connected to other circuit elements in any desired manner. For example, in the depicted embodiment, termination 10 is part of a plug-type connector. Each signal wire termination site 42 is therefore electrically connected to a respective one of terminal contact sites 46 by printed circuit traces 44. Some of terminal contact sites 46 are on the upper surface of circuit board 40 (see FIG. 2), while other terminal contact sites 46 are on the lower surface of that board (see FIG. 3). Terminal housing 80 containing a plurality of plug-type connector terminals 82 can be mounted on the edge of circuit board 40 opposite cable 20 so that each terminal 82 electrically contacts a respective one of terminal contact sites 46.

Figure 7:
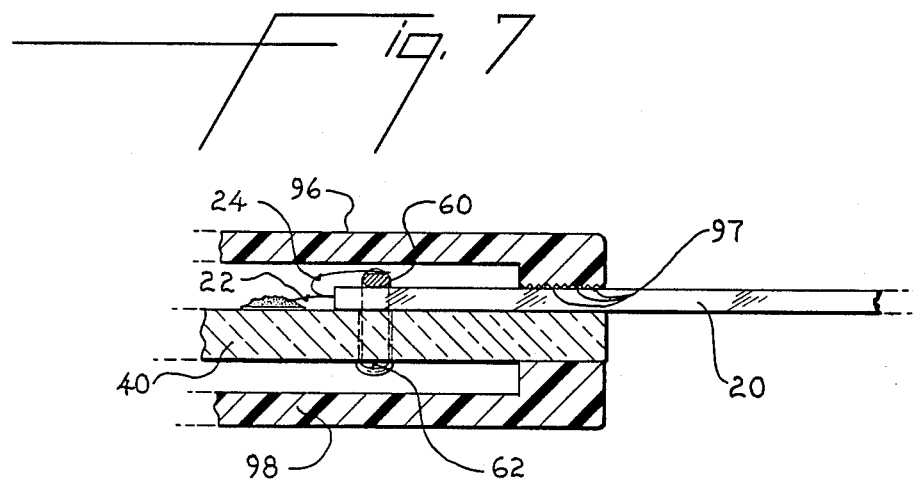
FIG. 7 is a partial cross sectional view taken along the line 7—7 in FIG. 2.

The uninsulated end portion of each ground wire 24 is bent back over the top of the mid-portion of bus member 60 and mechanically and electrically secured (e.g., by solder) to the top of bus member 60. If desired, bus member 60 may be electrically connected to one of terminal contact sites 46, e.g., by soldering the clinched ends 62 of bus member 60 to bus contact site 50 (FIG. 3) which is connected to the selected terminal contact site 46 in the same manner that signal wire termination sites 42 are connected to the other terminal contact sites 46. Also if desired, circuit board 40 may be sandwiched between upper and lower covers 90 and 92 as shown in FIG. 2. Covers 90 and 92 may be held together by any suitable means such as bolts, screws, or rivets through holes 94. Upper cover 90 may help secure cable 20 to the termination by clamping the cable against circuit board 40. If desired, upper cover 90 may have ridges 97 transverse to the longitudinal axis of cable 20 and in contact with cable insulation 26 to better secure the cable to the termination (see FIG. 7).

Figure 5C:
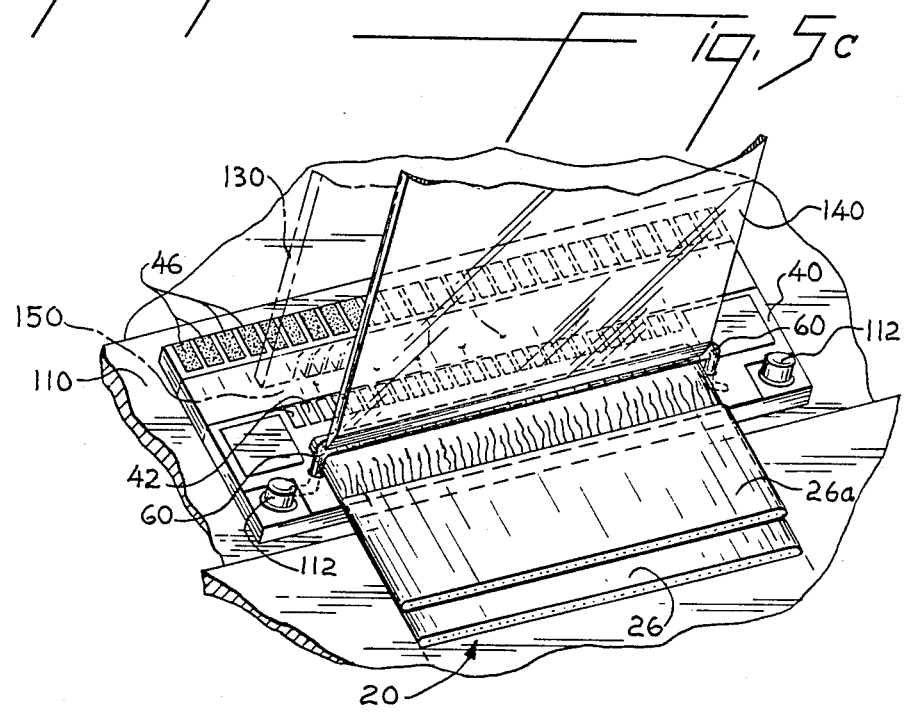
Figure 6:
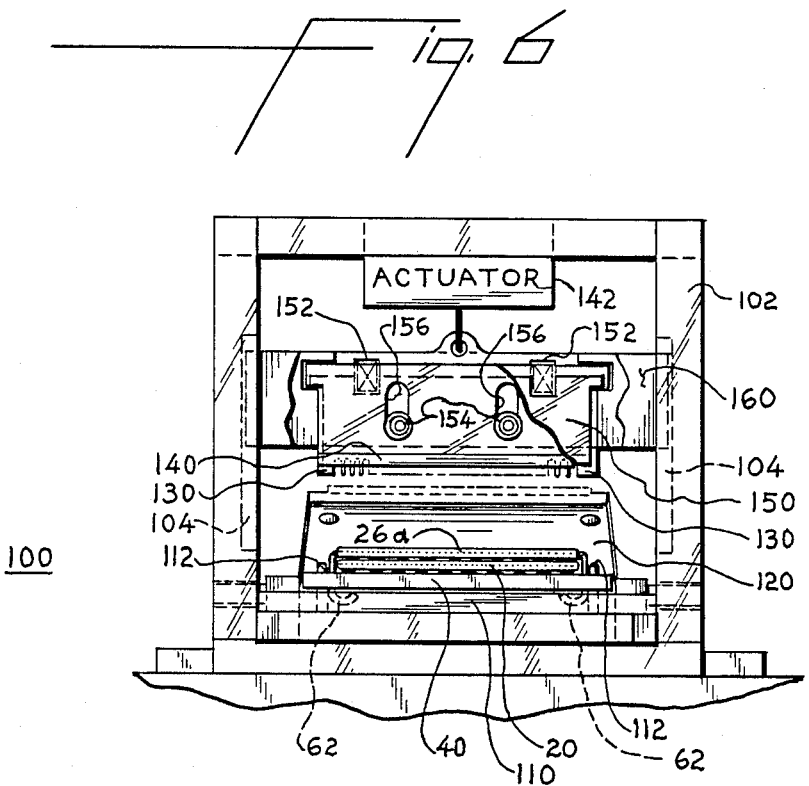
FIG. 6 is an end elevational view of the apparatus of FIGS. 4 and 5 showing an operating cycle stage similar to the stage shown in FIGS. 4b and 5b.

Terminations of the type described above can be made using the apparatus 100 shown in FIGS. 4–6. This apparatus includes a base 110 having a pair of upwardly projecting guide pins 112. Circuit board 40 is placed on base 110 with guide pins 112 in holes 94. Wire guide 120 pivots down on top of a portion of circuit board 40 to one side of the array of signal wire termination sites 42. The portion of wire guide 120 adjacent to the signal wire termination sites has a plurality of upwardly extending ground wire supports 124 which are separated from one another by downwardly extending signal wire slots 122. Each signal wire slot 122 is aligned with a respective one of the signal wires 22 in the cable to be terminated at circuit board 40. Each ground wire support 124 is similarly aligned with a respective one of ground wires 24. Preferably each ground wire support 124 has a shallow notch for receiving the associated ground wire.

Cable 20 is prepared for termination by cutting through insulation 26 (but not any of wires 22 or 24) perpendicular to the longitudinal axis of the cable. The portion 26a of the insulation beyond this cut is pulled away from the remaining insulation 26 to expose a length of wires 22 and 24 (see FIGS. 4a and 5a). However, the ends of wires 22 and 24 preferably remain in insulation portion 26a. Cable 20 is then placed on circuit board 40 and wire guide 120 so that (1) insulation portion 26a is on the side of ground wire supports 124 remote from signal wire termination sites 42, (2) the end of insulation portion 26 is between signal wire termination sites 42 and the site at which bus member 60 will be located, (3) each signal wire 22 traverse a respective one of signal wire termination sites 42 and passes through a respective one of signal wire slots 122, and (4) each ground wire 24 traverses a respective one of ground wire supports 124.

The next step in the operation of the apparatus is the insertion of bus member 60. Bus member 60 is initially U-shaped. The parallel legs 62 of the bus member are inserted downwardly into holes in circuit board 40 on respective opposite sides of cable 20. The mid-portion of bus member 60 traverses the end of cable insulation 26.

Next, the apparatus is operated to lower signal wire cutter 130 and ground wire cutter 140 (see FIG. 5a'). Any suitable means such as a mechanical linkage or a hydraulic or pneumatic actuator 142 (FIG. 6) can be used to lower and then subsequently raise cutters 130 and 140. Cutters 130 and 140 are fixed relative to one another by cutter support 160 and are guided for vertical motion by lateral extension of cutter support 160 into vertical slots 104 in the frame 102 of apparatus 100. Signal wire cutter 130 comes down immediately adjacent to the face of wire guide 120 which faces toward signal wire termination sites 42. Signal wire cutter 130 has a plurality of downwardly extending signal wire cutting teeth 132, each of which is aligned with a respective one of signal wire slots 122. Signal wire cutting teeth 132 are separated from one another by ground wire slots 134, each of which is aligned with a respective one of ground wires 24. Accordingly, all of signal wires 22 are cut or sheared by cooperation of the bottoms of signal wire slots 122 and signal wire cutting teeth 132. Ground wires 24 enter ground wire slots 134 and are therefore not cut by signal wire cutter 130. Signal wire cutting teeth 132 push the sheared ends of signal wires 22 which remain connected to main insulation 26 down onto signal wire termination sites 42.

At the same time that signal wire cutter 130 is cutting signal wires 22, ground wire cutter 140 comes down on top of the mid-portion of bus member 60. Ground wire cutter 140 forces bus member 60 downwardly so that it firmly clamps the end of insulation 26 against circuit board 40. The downward driving of bus member 60 in this manner also causes the lower ends of bus member legs 62 to be clinched or crimped against the under side of circuit board 40. Anvil pockets 114 (FIG. 4) may be provided in base 110 to guide the crimped bus member legs 62 in any desired direction. Spacer member 150, which is located between cutters 130 and 140, provides additional support and guidance for bus member 60 while the bus member is being driven by ground wire cutter 140. Spacer member 150 generally travels with cutters 130 and 140, but it is also capable of some vertical motion relative to the cutters. Spacer member 150 is resiliently biased downward relative to cutters 130 and 140 by prestressed compression coil springs 152 acting between spacer member 150 and cutter support 160. Spacer member 150 is guided for vertical motion relative to cutters 130 and 140 by pins 154 which extend through spacer member 150 and into slots 156 in cutters 130 and 140. Elements 152, 154, and 156 allow spacer member 150 to move upwardly relative to cutters 130 and 140 so that spacer member 150 does not interfere with completion of the downward stroke of cutters 130 and 140. It should be noted that on this stroke of the apparatus, ground wire cutter 140 does not contact or cut any wires.

As shown in FIGS. 4b and 5b, the next step in the operation of the apparatus is to raise cutters 130 and 140, to fold insulation portion 26a back over insulation 26, and to pivot wire guide 120 away from circuit board 40. Because signal wires 22 have been cut, the portions of those wires which extend from insulation 26 remain in place over signal wire termination sites 42. The cut-off end portions of signal wires 22 remain with insulation portion 26a. When insulation portion 26a is folded back as described above, it also carries with it the exposed portions of ground wires 24. Accordingly, ground wires 24 pass over the top of the mid-portion of bus member 60.

As shown in FIGS. 4c and 5c, the next step in the operation of the apparatus is to again lower cutters 130 and 140. The lower edge of cutter 140 comes down on top of the mid-portion of bus member 60, cutting through the ground wires 24 which pass over the top of the bus member. All the wires to insulation portion 26a have now been cut. Portion 26a can therefore be removed and discarded.

The next step in the operation of the apparatus is to raise cutters 130 and 140 again. The ends of signal wires 22 can now be soldered to their respective signal wire termination sites 42, and the ends of ground wires 24 can be soldered to the top of bus member 60. Thereafter, cable 20 and circuit board 40 can be removed from the apparatus, and covers 90 and 92 and other elements such as terminal housing 80 can be added.

If desired, cables can be terminated on both sides of circuit board 40 as shown in FIG. 1. As shown in that Figure, cable 20a is terminated on the upper surface of circuit board 40, and thereafter cable 20b is terminated on the lower surface of that board. Bus member 60a is used in the termination of cable 20a, and in order to avoid any interference with the termination of cable 20b, the ends 62a of bus member 60a are preferably crimped outwardly away from cable 20b. Similarly, bus member 60b is used in the termination of cable 20b, and in order to avoid any interference with the termination of cable 20b, the ends 62b of bus member 60b are preferably crimped outwardly away from cable 20a. The circuit board 40 in FIG. 1 can be similar to the circuit board 40 described above in connection with the other Figures except that in FIG. 1 the circuit board has signal wire termination sites on both of its major surfaces, as well as two sets of apertures for bus members 60a and 60b to pass through.

The termination shown in FIG. 1 can be made by apparatus similar to that described above. Cable 20a is terminated as described above. Then the partially completed termination is turned over and reinserted in the apparatus. Base 110 is shifted slightly relative to cutters 130 and 140 along an axis parallel to the longitudinal axis of the cables so that cutter 140 will come down on bus member 60b even though bus member 60b is at a slightly different position than bus member 60a. Cable 20b is then terminated in the same manner as cable 20a. Thereafter, the termination is removed from the apparatus and other elements such as terminal housing 84 and covers 96 and 98 are added.

I claim:

1. The method of terminating an electrical cable at a planar circuit board, the cable having a plurality of interspersed co-planar signal and ground wires embedded in a substantially planar insulating sheath, and the circuit board having a plurality of signal wire termination sites disposed in a longitudinal array on a first major surface of the circuit board, the lateral spacing of the signal wire termination sites corresponding to the lateral spacing of the signal wires in the cable, the method comprising the steps of:

cutting the cable insulation transverse to the longitudinal axis of the cable adjacent the end of the cable to be terminated;

sliding the severed end portion of the insulation along the wires away from the remainder of the insulation to expose a portion of each wire between the severed end portion and the remainder of the insulation;

positioning the cable relative to the circuit board so that the plane of the cable is parallel to the plane of the circuit board, so that the longitudinal axis of the cable is substantially perpendicular to the longitudinal axis of the signal wire termination site array, and so that the exposed portion of each signal wire traverses a respective one of the signal wire termination sites;

placing a bus member across the cable insulation upstream of the exposed portions of the wires;

securing the bus member to the circuit board to clamp the cable to the circuit board;

cutting the signal wires between the signal wire termination sites and the severed end portion of the insulation;

folding the severed end portion of the insulation back on the portion of the cable upstream of the bus member so that the exposed portions of the ground wires pass over the top of the bus member;

cutting the ground wires at the bus member;

mechanically and electrically connecting each signal wire to the associated signal wire termination site; and mechanically and electrically connecting each ground wire to the bus member.

2. The method defined in claim 1 wherein the ground wires are cut along the top of the bus member.

3. The method defined in claim 1 wherein the bus member has legs which pass through the circuit board on each side of the cable, and wherein the step of securing the bus member to the circuit board includes the step of clinching the ends of the bus member legs against the second major surface of the circuit board which is opposite the first major surface.

4. The method defined in claim 1 wherein the signal wires are soldered to the signal wire termination sites, and wherein the ground wires are soldered to the bus member.

5. The method defined in claim 1 further comprising the step of attaching a cover to the circuit board so that the signal wire termination sites and the bus member are enclosed between the cover and the circuit board.

6. The method defined in claim 1 wherein the circuit board has a second plurality of signal wire termination sites disposed in a longitudinal array on the second major surface of the circuit board which is opposite the first major surface, and wherein a second similar cable is terminated using the second signal wire termination sites, the lateral spacing of the second signal wire termination sites corresponding to the lateral spacing of the second cable signal wires, the method comprising the further steps of:

cutting the second cable insulation in the same manner as the first cable;

sliding the severed end portion of the second cable insulation in the same manner as the severed end portion of the first cable;

positioning the second cable relative to the circuit board so that the plane of the second cable is parallel to the plane of the circuit board, so that the longitudinal axis of the second cable is substantially perpendicular to the longitudinal axis of the second signal wire termination site array, and so that the exposed portion of each second signal wire traverses a respective one of the second signal wire termination sites;

placing a second bus member across the second cable insulation upstream of the exposed portions of the wires;

securing the second bus member to the circuit board to clamp the second cable to the circuit board;

cutting the second cable signal wires between the second signal wire termination sites and the severed end portion of the second cable insulation;

folding the severed end portion of the second cable insulation back on the portion of the second cable upstream of the second bus member so that the exposed portions of the second cable ground wires pass over the top of the second bus member;

cutting the second cable ground wires at the second bus member;

mechanically and electrically connecting each second cable signal wire to the associated second signal wire termination site; and mechanically and electrically connecting each second cable ground wire to the second bus member.

7. The method defined in claim 6 wherein the longitudinal axes of the two signal wire termination site arrays are substantially parallel, and wherein both cables extend from the circuit board in substantially the same direction.

8. The method defined in claim 6 wherein the second cable ground wires are cut along the top of the second bus member.

9. The method defined in claim 6 wherein the second bus member has legs which pass through the circuit board on each side of the second cable, and wherein the step of securing the second bus member to the circuit board includes the step of clinching the ends of the second bus member legs against the first major surface of the circuit board.

10. The method defined in claim 6 wherein the second cable signal wires are soldered to the second signal wire termination sites and wherein the second cable ground wires are soldered to the second bus member.

11. The method defined in claim 6 further comprising the step of attaching a second cover to the circuit board so that the second signal wire termination sites and the second bus member are enclosed between the second cover and the circuit board.

* * * * *